United States Patent [19]

Yamada

[11] Patent Number: 4,644,402
[45] Date of Patent: Feb. 17, 1987

[54] SOLID STATE IMAGE SENSOR
[75] Inventor: Hidetoshi Yamada, Tokyo, Japan
[73] Assignee: Olympus Optical Company Limited, Tokyo, Japan
[21] Appl. No.: 736,073
[22] Filed: May 20, 1985
[30] Foreign Application Priority Data May 31, 1984 [JP] Japan ................................ 59-109615

[51] Int. Cl.$^4$ ............................................ H04N 3/14
[52] U.S. Cl. ...................................... 358/213; 357/30
[58] Field of Search ............................... 358/213, 212; 357/24 LR, 22, 30; 250/578

[56] References Cited

U.S. PATENT DOCUMENTS

| 3,906,544 | 9/1975 | Engeler et al. | 357/30 |
| 4,323,912 | 4/1982 | Koike et al. | 357/30 |
| 4,363,963 | 12/1982 | Ando | 250/578 |
| 4,524,391 | 6/1985 | Nishizawa et al. | 358/213 |
| 4,525,742 | 6/1985 | Nishizawa et al. | 358/213 |
| 4,531,156 | 7/1985 | Nishizawa et al. | 358/213 |
| 4,562,474 | 12/1985 | Nishizawa | 358/213 |
| 4,571,624 | 2/1986 | Nishizawa et al. | 357/24 LR |
| 4,589,003 | 5/1986 | Yamada et al. | 357/30 |

Primary Examiner—Gene Z. Rubinson
Assistant Examiner—Stephen Brinich
Attorney, Agent, or Firm—Parkhurst & Oliff

[57] ABSTRACT

A solid state image sensor having row lines connected to a vertical scanning circuit, column lines connected to a horizontal scanning circuit, a video line selectively connected to the column lines, and pixels arranged at cross points between the row and column lines, each pixel including a static induction transistor having a drain connected to the ground, a source connected to a column line and a gate connected to a capacitor formed by a gate electrode connected to the gate, a photoconductive film applied on the gate electrode and a transparent electrode applied on the photoconductive layer. The transparent electrode may be divided into a plurality of parts each of which extends in a row direction and is connected to respective row line.

11 Claims, 16 Drawing Figures

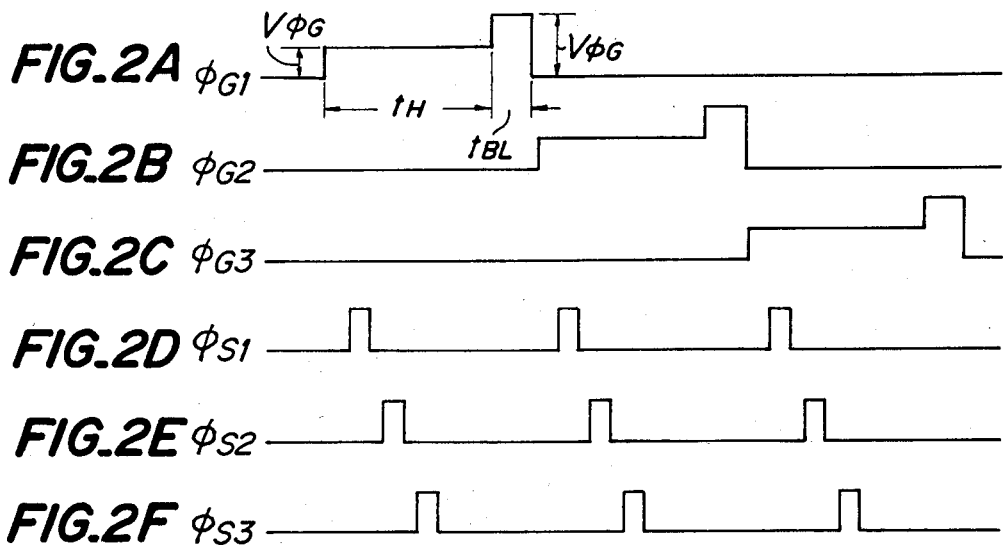
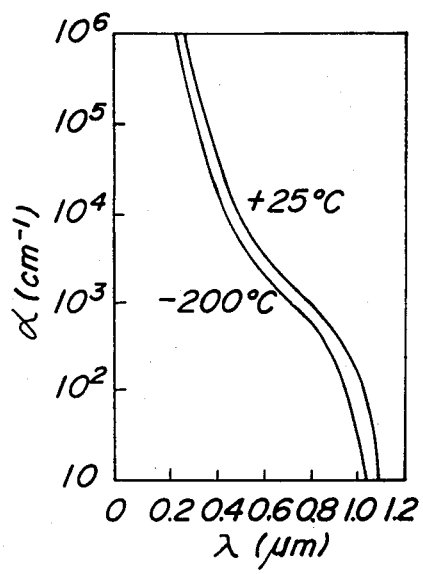

SOLID STATE IMAGE SENSOR

BACKGROUND OF THE INVENTION

The present invention relates to a solid state image sensor comprising a plurality of pixels formed by static induction transistors having both a photoelectric converting function and a switching function.

Heretofore, there have been proposed various solid state image sensors comprising a charge transfer device such as CCD and BBD, and MOS transistors. However, such known image sensors have drawbacks in that electric charges are leaked during the charge transfer and the photodetection sensitivity is low. In order to avoid such drawbacks, there has been proposed a solid stage image sensor comprising static induction transistors (hereinafter abbreviated as SIT). For instance, in an European Patent Application No. 83900059.3 (Publication No. 96725), there is described a solid state image sensor comprising SITs each of which serve as a photodetecting element and a switching element. The inventor of the instant application has also proposed in U.S. patent application Ser. No. 647,169 filed on Sept. 4, 1984, a solid state image sensor comprising SITs., which solid state image sensor has a higher sensitivity and is easily manufactured. This solid state image sensor can read out an image signal while stored charges remain undestroyed and can have a high sensitivity by prolonging the time period of accumulating photocarriers.

FIGS. 1A and 1B show an embodiment of the solid state image sensor comprising SITs as proposed in the above mentioned Patent Application. A SIT shown in FIG. 1A comprises an n+ substrate 1 which serves as a drain of the SIT, a lightly doped n− epitaxial layer 2 which is grown on the substrate 1 and serves as a channel, an n+ source region 3 and p+ gate regions 4 formed in the epitaxial layer 2 by means of, for example, a thermal diffusion, source electrode connected to the source region 3 and gate electrodes 6 arranged above the gate regions 4 via an insulating film 5 such as $SiO_2$ to form a gate capacitor 7. The SIT is isolated from adjacent SITs by means of an isolation region 9 formed by a burried insulating substance. A number of SITs are arranged in a matrix on the same substrate.

FIG. 1B is a circuit diagram illustrating a whole construction of the solid state image sensor comprising normally-on type SITs shown in FIG. 1A. Drains (substrate) of SITs 10-11 to 10-mn forming pixels arranged in a matrix are commonly connected to ground, and to gate electrodes of SITs 10-11 to 10-1n; . . .; 10-m1 to 10-mn arranged in the X direction, i.e. in a row, are connected row lines 11-1 to 11-m, respectively, which lines are then connected to a vertical scanning circuit 16 to receive row selection signals $\phi G1$ to $\phi Gm$. Source electrodes of SITs 10-11 to 10-m1; . . .; 10-1n to 10-mn arranged in the Y direction, i.e. in a column are connected to column lines 12-1 to 12-n, respectively, whose first ends are connected to a video voltage source Vs via respective column selection transistors 13-1 . . . 13-n, a common video line 14 and a load resistor 15. To gates of the column selection transistors 14-1 to 14-n are applied column selection signals $\phi S1$ to $\phi Sn$, respectively from a horizontal scanning circuit 17.

In the SIT having the construction explained above, when a light input is given, electron-hole pairs are induced in the channel region 2 and a gate depletion region. Electrons are conducted away into the drain 1 connected to ground, and holes are stored in the signal storing gate region 4 and thus the gate capacitance 7 connected thereto is charged to vary a gate potential by $\alpha V_G$. Now it is assumed that an amount of electrostatic charges stored in the gate region 4 is represented by $Q_L$ and the capacitance of the gate capacitor 7 is denoted by $C_G$, then $\alpha V_G = Q_L/C_G$ is obtained. After a certain accumulation time, when a readout pulse $V_{\phi G}$ is applied to the gate terminal 8, the gate potential is changed into a sum of $V_{\phi G}$ and $\alpha V_G$. Then, a potential difference between the signal storing gate region 4 and source region 3 is lowered to decrease the depletion layer and a drain current having an amplitude corresponding to the light input begins to flow between the source and drain. Due to the amplifying function of SIT, the drain current is multiplied by the amplification factor of the SIT. It should be noted that even if the source and drain of the SIT are exhanged, a similar operation to that explained above may be effected.

FIGS. 2A to 2F illustrate waveforms of the signals applied to the row lines 11-1 to 11-m and column selection transistors 14-1 to 14-n. As illustrated in FIGS. 2A to 2F, in this solid state image sensor, the successive pixels are readout by successively selecting the row lines 11-1 to 11-m as well as by successively selecting the column lines 13-1 to 13-n while a row line has been selected. Each of the signals applied to the row lines has a lower voltage $V_{\phi G}$, and a higher voltage $V_{\phi R}$. During the line scanning period $t_H$ the row selection signal has the voltage $V_{\phi G}$ and during a horizontal blanking period $t_{BL}$ the row selection signal assumes the voltage $V_{\phi R}$. Each of the column selection signals $\phi S1$, $\phi S2$ . . . applied to the gates of the column selection transistors has a low level for cutting off the transistor and a high level for making the transistor conductive.

When the vertical scanning signal $\phi G1$ is increased to the high voltage $V_{\phi G}$, SITs connected to the first row line 11-1 are selected and the SITs are successively read out while the column selection transistors 13-1, 13-2 . . . 13-n are successively made conductive by means of the horizontal scanning signals $\phi S1$, $\phi S2$ . . . $\phi Sn$. In this manner, a video signal of one line is derived on the video line 14. Then, the SITs in the first row are simultaneously reset when the vertical scanning signal $\phi G1$ is increased to the higher level $V_{\phi R}$.

Next, when the vertical scanning signal $\phi G2$ is changed to the voltage $V_{\phi G}$, all SITs 10-21, 10-22 . . . $\phi$-2n connected to the second row line 11-2 are selected and are successively readout by means of the horizontal scanning signals $\phi S1$, $\phi S2$ . . . $\phi Sn$.

In this manner, successive pixels are readout to derive a video signal of one frame.

The inventor has found that the known solid state image sensor mentioned above has the following drawbacks. In the image sensor, the accumulation of photocarriers induced by the incident light is effected in the channel region 2 and gate depletion layer in each SIT. The accumulating regions correspond to portions in the channel region which situated between the gate regions and isolating region, and underneath the gate regions. It is apparent that the portions between the gate regions and isolating region are liable to be small as the dimension of pixels is made smaller. Then, a major portion which serves to accumulate the photocarriers would be the portion in the channel region situated underneath the gate region 4, and thus, the incident light has to transmit through the gate regions 4. In order to obtain a large amplification of the SIT, a depth Xj of the gate region 4 has to be relatively thick such as 2 to 4 μm. Therefore, the incident light, particularly components of short wavelengths (blue light) is abosrbed in the gate region 4 and cannot penetrate to the portion of channel region underneath the gate region.

FIG. 3 is a graph showing a light absorption coefficient α of silicon in dependence upon wavelength λ of incident light. If it is assumed that λ=0.4 μm and the thickness of the P+ gate region is 3 μm, then $\alpha = 6 \times 10^{-4} \text{cm}^{-1}$, and a light transmittivity becomes a very small value such as $e^{-6 \times 10^4 \times 3 \times 10^4} = 1.5 \times 10^{-8}$. In this manner, the known solid state image sensor has a very low sensitivity especially for blue light and thus a color camera comprising the solid state image sensor having a high sensitivity over a whole sepectrum of visible light can not be realized.

SUMMARY OF THE INVENTION

The present invention has for its object to provide a solid state image sensor including SITs, which image sensor has a high light receiving efficiency even if pixels are small.

It is still another object of the invention to provide a solid state image sensor especially advantageous for use in a color camera having a high sensitivity over the whole spectrum of visible light and a high integration density.

According to the invention, a solid state image sensor comprises
  a plurality of row lines;
  a vertical scanning means for successively supplying row selection signals to the plurality of row lines;
  a plurality of column lines;
  a horizontal scanning means for successively supplying column selection signals to the plurality of column lines;
  a plurality of pixels connected at cross points between the row and column lines, each pixel including a static induction transistor having a first main electrode connected to a column line, a second main electrode connected commonly to second main electrodes of other static induction transistors, a channel region arranged between the first and second main electrodes, and a gate region, a capacitor connected between the gate region of the respective static induction transistor and a row line, and a photoconductive film connected to the gate region of the respective static induction transistor; and
  a video line selectively connected to the column lines to readout a video signal from the pixels.

BRIEF DESCRIPTION OF THE DRAWINGS

FIGS. 2A to 2F are signal waveforms for explaining the operation of the solid state image sensor shown in FIG. 1B;

FIG. 3 is a graph depicting a dependency of the light absorption coefficient of silicon upon the wavelength of light;

DESCRIPTION OF THE PREFERRED EMBODIMENTS

Figure 4A:
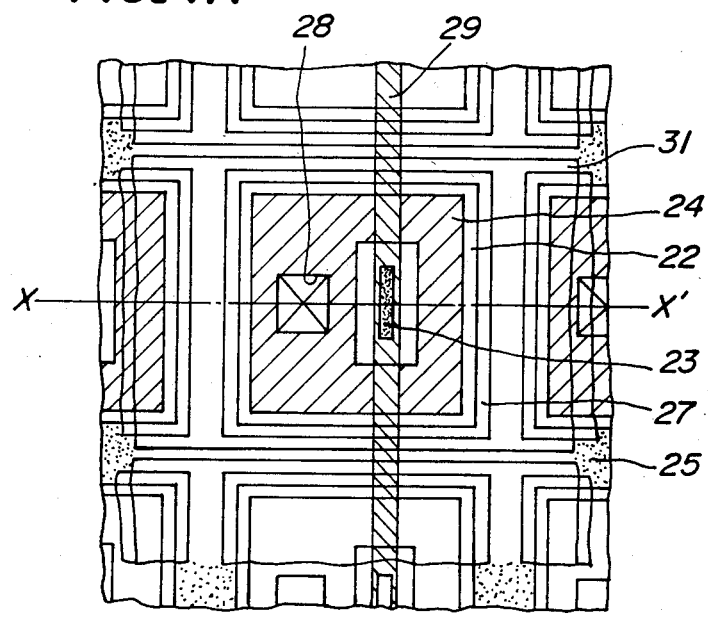
FIGS. 4A and 4B are plan and sectional views, respectively illustrating an embodiment of the solid state image sensor according to the invention.
Figure 4B:
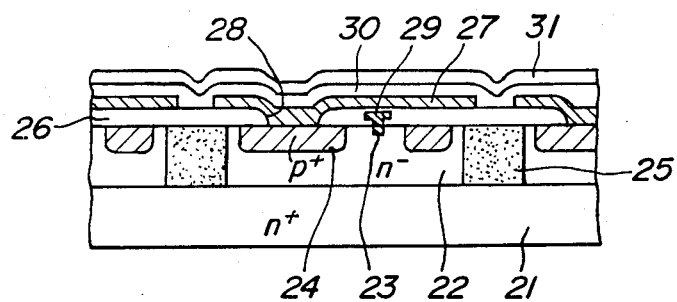

FIG. 4A is a plan view showing an embodiment of the solid state image sensor according to the invention, and FIG. 4B is a cross section cut along a line X-X' in FIG. 4A. In the drawing, a reference numeral 21 denotes an n+ silicon substrate forming a drain of SIT, 22 an n− epitaxial layer constituting a channel region, 23 a source of the SIT, 24 a P+ gate region of the SIT and a reference numeral 25 denotes an isolation region for isolating the SIT from adjacent SITs. On a surface of the epitaxial layer 22 is provided an insulating film 26 made of $SiO_2$ or PSG (Phospho Silicate Glass). A gate electrode 27 is connected to the gate region 24 through a contact hole 28 formed in the insulating film 26. There is further provided a source electrode 29 connected to the source region 23. It should be noted that the source electrode 29 is commonly connected to the source regions of SITs aligned in a column. In the present embodiment, there is further provided on the gate electrode 27 a photoconductive layer 30 made of amorphous silicon and compound semiconductor such as ZnSe. A transparent electrode 31 is further provided on the photoconductive layer 30. As shown in FIG. 4A, the transparent electrode 31 is divided into strips which extend in a direction perpendicular to the source electrode 29, i.e. in a row direction.

In the solid state image sensor, the gate electrode 27, transparent electrodes 31 and photoconductive layer 30 interposed therebetween form a capacitor. Further the transparent electrodes 31 consititute row lines similar to the row lines 11-1, 11-2 . . . shown in FIG. 1B and the source electrodes 29 form the column lines 12-1, 12-2 . . . Therefore, the solid state image sensor of the present embodiment may be formed substantially in a similar manner to that explained above with reference to FIG. 1B and the pixels can be readout by the XY address method.

Figure 1A:
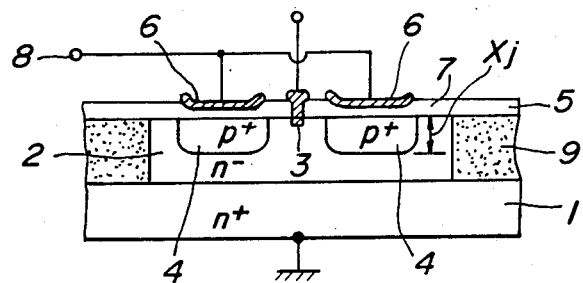
FIG. 1A is a cross sectional view showing the construction of the static induction transistor which has been previously proposed by the inventor.
Figure 1B:
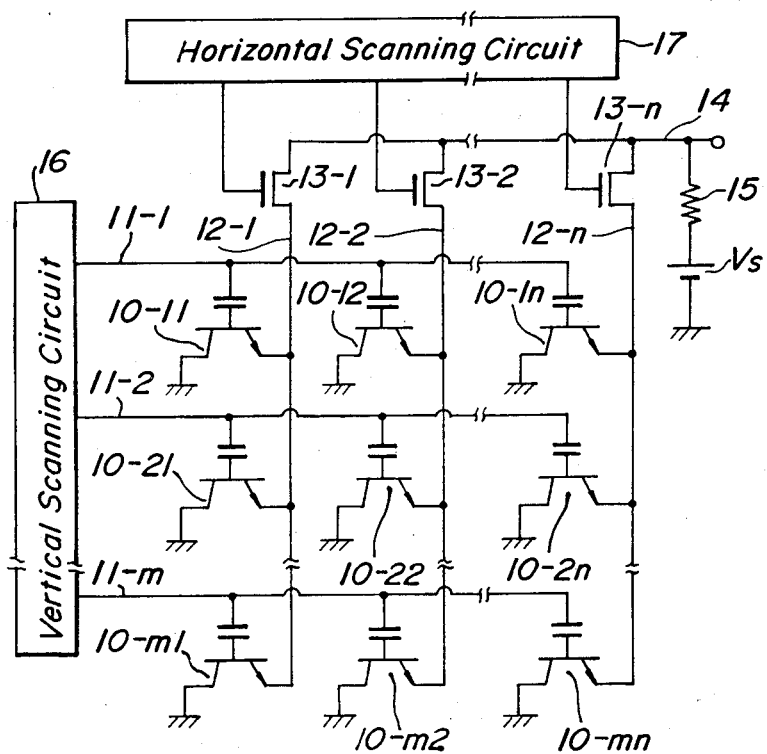
FIG. 1B is a circuit diagram illustrating the construction of a solid state image sensor comprising the static induction transistors shown in FIG. 1A.

Now the operation of the solid state image sensor of the present embodiment will be explained also with reference to the circuit diagram illustrated in FIG. 1A and the waveforms shown in FIGS. 2A to 2F.

When the vertical scanning signal $\phi G1$ is changed to the high reset voltage $V_{\phi R}$, the voltage $V_{\phi R}$ is applied to the column line 11-1, and thus p-n junctions between gates and drains of SITs 10-11, 10-12 . . . 10-1n connected to the column line 11-1 are forwardly biased. Therefore, the capacitor formed by the gate electrode 27, photoconductive film 30 and transparent electrode 31 is charged up to the voltage $(V_{\phi R}-\phi B)$, wherein $\phi B$ is a forward voltage of the pn-junction. Thereafter, when the vertical scanning signal $\phi G1$ is changed to 0 V, the voltage $(V_{\phi R}-\phi B)$ is stored in the capacitor and the gate voltage $V_G$ of each of SITs 10-11, 10-12 . . . 10-1n becomes equal to $-(V_{\phi R}-\phi B)$.

Under the above condition, when light is made incident upon a SIT, the resistance of the photoconductive film 30 is decreased, so that the charge stored in the capacitor is discharged to increase the gate voltage $V_G$. The increment of the gate voltage is substantially proportional to an amount of the incident light.

After a readout period has elapsed, when the vertical scanning signal $\phi G1$ is changed to $V_{\phi G}$, the voltage $V_{\phi G}$ is applied to the row line 11-1. Then, the gate voltages of the SITs 10-11, 10-12 . . . 10-1n are further increased by $V_{\phi G}$. Therefore, the SITs 10-11, 10-12 . . . 10-1n are successively read out by making the column transistors 13-1, 13-2 . . . 13-n successively conductive by means of the column selection signals. In this manner, a video signal of one line is derived. Then, the vertical scanning signal $\phi G1$ is changed into $V_{\phi R}$, the gates of SITs 10-11, 10-12 . . . 10-1n are simultaneously reset and the gate potential becomes equal to $-(V_{\phi R}-\phi B)$. In the manner expalined above, SITs of successive rows are to obtain a video signal of one frame.

As explained above, in the present embodiment of the solid state image sensor according to the invention, since the photoelectric conversion is carried out in the photoconductive film arranged on the gate electrode, there can be obtained high sensitivity over the whole visible light spectrum wavelength range. Moreover, an aperture ratio of the light receiving portion can be made high, and thus high density and high integration can be attained.

Figure 5A:
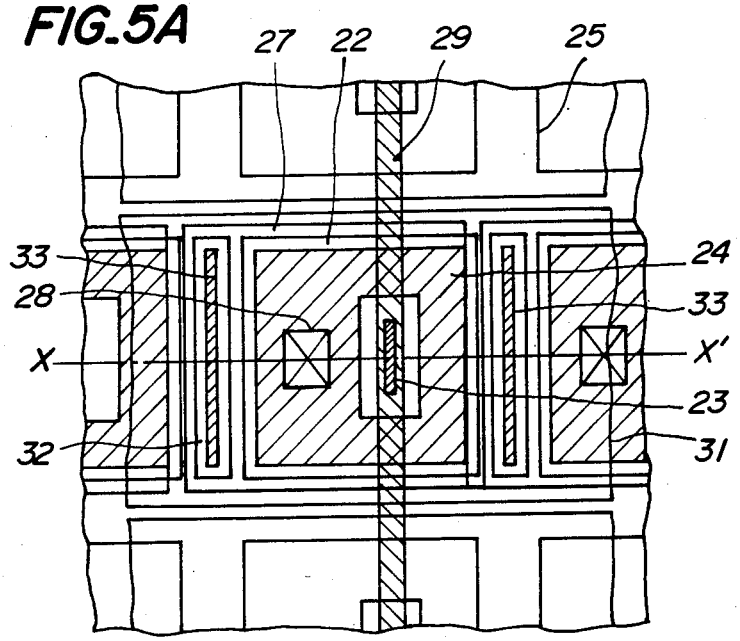
FIGS. 5A and 5B are plan and cross sectional views, respectively depicting another embodiment of the solid state image sensor according to the invention.
Figure 5B:
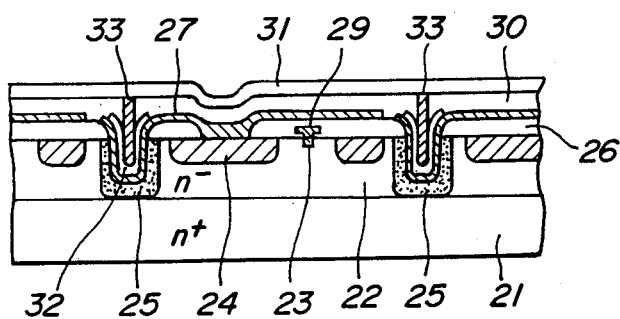

FIGS. 5A is a plan view showing another embodiment of the solid state image sensor according to the invention, and FIG. 5B is a cross section cut along a line X-X' in FIG. 5A.

Also in the present embodiment, on a silicon substrate 21 forming a drain region of SIT is provided an n⁻ expitaxial layer 22 forming a channel region and in the epitaxial layer is formed a source region 23 and a gate region 24 of the SIT. The SIT is separated by an isolating region 25 having a recess formed in the epitaxial layer, and in the recess an extended gate electrode 27, an insulating film 32 and a capacitor electrode 33 are deposited successively. This construction may be manufactured by the following steps.

(1) A U-shaped recess is formed in the epitaxial layer 22 by means of a reactive ion etching (RIE).
(2) Walls of the U-shaped recess in the epitaxial layer is changed into a $SiO_2$ film 25 by means of a thermal oxidation.
(3) A polysilicon film serving as the gate electrode 27 is formed by the CVD method.
(4) The insulating film 32 made of $SiO_2$ is formed by thermally oxidizing the polysilicon film 27.
(5) The photoconductive film 30 is applied on the gate electrode 27 and then the capacitor electrode 33 is formed in the photoconductive film 30.

In FIGS. 5A and 5B, a reference numeral 29 denotes a source electrode and a reference numeral 31 represents a transparent electrode formed in contact with the capacitor electrodes 33. The source electrodes 29 and transparent electrodes 31 are arranged perpendicular to each other to form column lines and row lines, respectively.

In the present embodiment, the gate electrode 27, insulating film 32 and electrode 33 construct a capacitor which is connected across the gate region 24 and transparent electrode 31 in parallel with a capacitor formed by the gate electrode 27, photoconductive film 30 and transparent electrode 31. Therefore, the total capacitance becomes substantially larger than the capacitor of the embodiment illustrated in FIGS. 4A and 4B.

Usually, the photoconductive film 30 has a thickness of several micrometers in order to obtain a sufficiently high sensitivity. Therefore, in the first embodiment of FIGS. 4A and 4B, the capacitance of the capacitor might be smaller than that which is necessary for storing sufficiently large signal charges. Contrary to this, in the present embodiment, the total capacitance can be increased materially. Further, since the capacitor is formed substantially vertically in the isolating region, it is possible to obtain the large capacitance while an area forming the capacitor is small. The operation of the solid state image sensor of the present embodiment is entirely same as the previous embodiment.

Figure 6A:
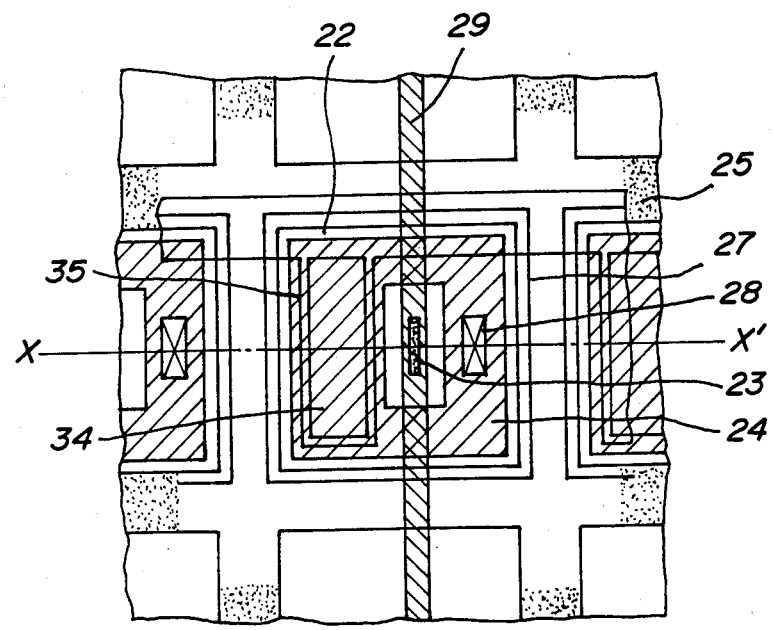
FIGS. 6A and 6B are plan and cross sectional views, respectively showing still another embodiment of the solid state image sensor according to the invention.
Figure 6B:
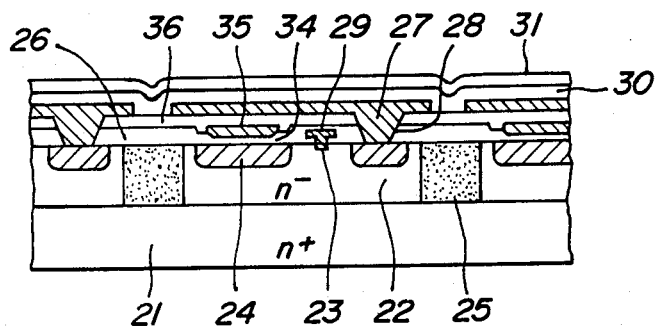

FIG. 6A is a plan view showing still another embodiment of the solid state image sensor according to the invention, and FIG. 6B is a cross sectional view cut along a line X-X' in FIG. 6A.

Also in the present embodiment, on a silicon substrate 21 forming the drain of SIT is formed an epitaxial layer 22 constituting a channel region in which are formed a source region 23 and a gate region 24.

On a part of the gate region 24 are successively deposited a thin insulating film 34 made of $SiO_2$ and a capacitor electrode 35 to form a capacitor. The capacitor electrodes 35 of SITs arranged in a row are interconnected with each other. To the gate region 24 is further connected a gate electrode 27 through a contact hole 28 formed in a relatively thick insulating film 26. The electrode 27 is extended over the capacitor electrode via an insulating film 36 made of phospho silicate glass, and a photoconductive layer 30 and a transparent electrode 31 are successively applied on the gate electrode 27. In the present embodiment, the photoconductive layer 30 and transparent electrode 31 are not patterned, but are formed uniformly. The capacitor electrode 35 and source electrode 29 are extended perpendicular to each other to form the row line and column line, respectively.

Figure 7:
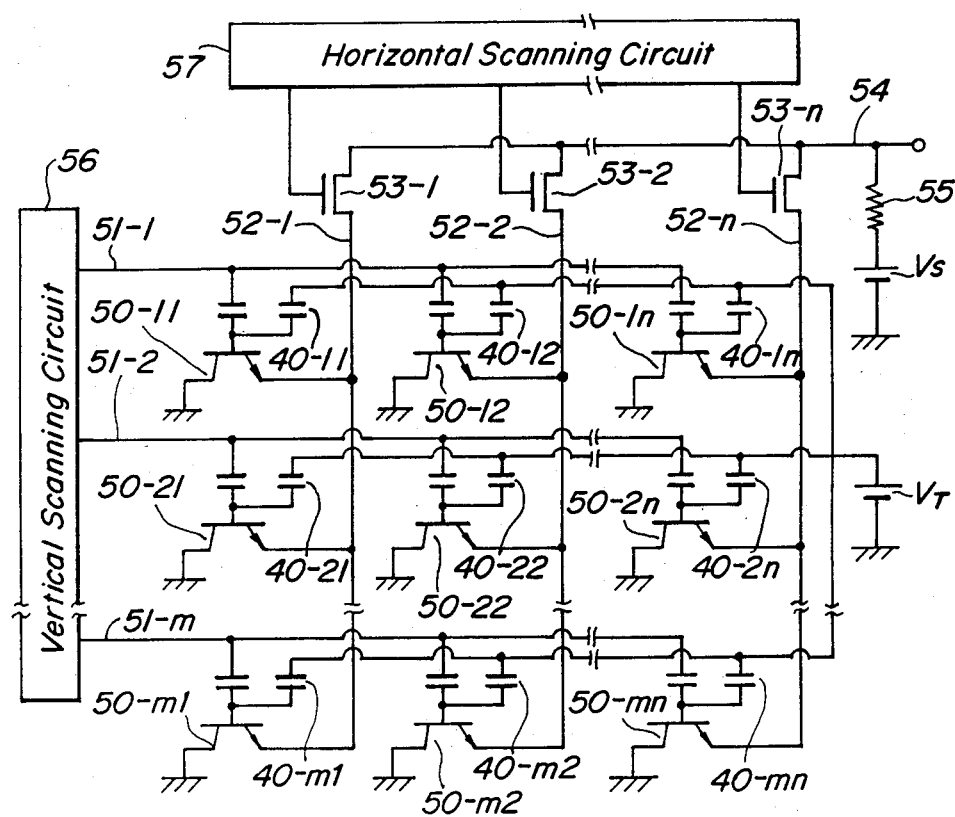
FIG. 7 is a circuit diagram showing the whole construction of the solid state image sensor illustrated in FIGS. 6A and 6B.

FIG. 7 is a circuit diagram showing a whole construction of the solid state image sensor according to the invention. The capacitor electrodes 35 constitute row lines 51-1, 51-2 . . . 51-m and source electrodes 29 form column lines 52-1, 52-2 . . . 52-n. To gate regions 24 of SITs 50-11, 50-12 . . . 50-mn forming pixels are connected capacitors 40-11, 40-12 . . . 40-mn, respectively formed by the photoconductive layer 30 and transparent electrode 31. The uniformly deposited transparent electrode 31 which constitutes outer electrodes of the capacitors 40-11, 40-12 . . . 40-mn is connected to a target voltage source $V_T$.

Now the operation of the solid state image sensor of the present embodiment will be explained also with reference to the signal waveforms illustrated in FIGS. 2A to 2F.

When the vertical scanning signal $\phi G1$ is increased to the reset voltage $V_{\phi R}$, this voltage $V_{\phi R}$ is applied to the row line 51-1 and the pn junctions of SITs 50-11, 50-12 . . . 50-1n connected to the row line 51-1 are forwardly biased and then the capacitors 50-11, 50-12 . . . 50-1n formed by the gate region 24 dielectric film 34 and capacitor electrode 35 are charged up to $(V_{\phi R}-\phi B)$. After that, when light is made incident upon a pixel and the resistance of the photoconductive film 30 is decreased, an electric current flows into the gate region 24 of SIT of the respective pixel from the target voltage source $V_T$ through the transparent electrode 31 and the photoconductive film 30 and the gate potential of the relevant SIT is increased. The increased gate potential is substantially proportional to an amount of light impinging upon the SIT.

After the readout period, when the vertical scanning signal $\phi G1$ is changed to the voltage $V_{\phi G}$, the voltage $V_{\phi G}$ is applied to the row line 51-1 and thus the gate potentials of SITs 50-11, 50-12 ... 50-1n connected to the respective row line 51-1 are increased by $V_{\phi G}$. Therefore, when the column selection transistors 53-1, 53-2 ... 53-n are made successively conductive by means of the column selection signals $\phi S1, \phi S2 ... \phi Sn$, the signals are readout on a video line 54 from the SITs 50-11, 50-12 ... 50-1n. In this manner, all the SITs are successively read out to derive the video signal of one frame.

In the embodiment just explained above, since the patterning for the photoconductive film and transparent electrode is not required, but they can be formed unifromly, the manufacturing process becomes simpler.

As explained above in detail, according to the invention, since the photoconductive film serving as the light receiving region is provided on the gate region of the SIT constituting the pixel and is connected thereto, even if the dimension of the pixel is made small, it is possible to attain high light receiving efficiency and high sensitivity over the whole spectrum of visible light. This results in the solid state color image sensor having the high density and sensitivity. Moreover, in the solid state image sensor according to the invention, the crosstalk between adjacent pixels can be completely avoided and therefore high definition can be obtained and color mixing can be effectively removed.

What is claimed is:

1. A solid state image sensor comprising
    a plurality of row lines;
    a vertical scanning means for successively supplying row selection signals to said plurality of row lines;
    a plurality of column lines;
    a horizontal scanning means for successively supplying column selection signals to said plurality of column lines;
    a plurality of pixels connected at cross points between the row and column lines, each of said pixels including a static induction transistor having a first main electrode connected to a column line, a second main electrode connected commonly to second main electrodes of other static induction transistors, a channel region arranged between the first and second main electrodes, and a gate region, a capacitor connected between the gate region of the respective static induction transistor and a row line, and a photoconductive film connected to the gate region of the respective static induction transistor, said capacitor comprising a gate electrode connected to the gate region, said photoconductive film applied on the gate electrode and a transparent electrode applied on the photoconductive film; and
    a video line connected selectively to the column lines to readout a video signal from the pixels.

2. A solid state image sensor according to claim 1, wherein said transparent electrode is divided into a plurality of strips which extend in a row direction and constitute respective row lines.

3. A solid state image sensor according to claim 2, wherein a single photoconductive film is uniformly deposited on all the pixels.

4. A solid state image sensor according to claim 2, wherein a plurality of photoconductive films are separately deposited on respective pixels.

5. A solid state image sensor according to claim 1, wherein each of said pixels further comprises an insulating film applied on a part of the gate electrode and a capacitor electrode applied on the insulating film, whereby said part of the gate electrode, insulating film and capacitor electrode constitute an additional capacitor.

6. A solid state image sensor according to claim 5, wherein said capacitor electrodes of pixels aligned in a row direction are connected to each other and constitute a row line, and the photoconductive films and transparent electrodes of all the pixels are formed uniformly.

7. A solid state image sensor according to claim 6, wherein the uniformly formed transparent electrode is connected to a target voltage source.

8. A solid state image sensor according to claim 5, wherein said additional capacitor is formed integrally with an isolating region at a boundary between adjacent pixels.

9. A solid state image sensor according to claim 8, wherein said capacitor electrode is extended through the photoconductive film and is connected to the transparent electrode, whereby said capacitor and additional capacitor are connected in parallel with each other.

10. A solid state image sensor according to claim 1, wherein said photoconductive film is made of amorphous silicon.

11. A solid state image sensor according to claim 1, wherein said photoconductive film is made of compound semiconductor.

* * * * *